US012604645B2

(12) United States Patent
Shi et al.

(10) Patent No.: US 12,604,645 B2
(45) Date of Patent: Apr. 14, 2026

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Bo Shi, Beijing (CN); Xiaoxue Wen, Beijing (CN); Rui Zhou, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 383 days.

(21) Appl. No.: 18/260,561

(22) PCT Filed: Apr. 12, 2022

(86) PCT No.: PCT/CN2022/086394
§ 371 (c)(1),
(2) Date: Jul. 6, 2023

(87) PCT Pub. No.: WO2023/197165
PCT Pub. Date: Oct. 19, 2023

(65) Prior Publication Data
US 2024/0389436 A1 Nov. 21, 2024

(51) Int. Cl.
H10K 59/80 (2023.01)
G06F 3/044 (2006.01)
H10K 59/40 (2023.01)

(52) U.S. Cl.
CPC ......... H10K 59/879 (2023.02); G06F 3/0443 (2019.05); G06F 3/0446 (2019.05); H10K 59/40 (2023.02); G06F 2203/04111 (2013.01)

(58) Field of Classification Search
None
See application file for complete search history.

(56) References Cited

U.S. PATENT DOCUMENTS 11,239,448 B2 2/2022 Zhang et al.
2021/0384272 A1 12/2021 Zhang et al.
(Continued)

FOREIGN PATENT DOCUMENTS

CN 100588302 C 2/2010
CN 101257077 B 12/2010
(Continued)

OTHER PUBLICATIONS

Written Opinion from PCT/CN2022/086394 dated Dec. 15, 2022.
International Search Report from PCT/CN2022/086394 dated Dec. 15, 2022.

*Primary Examiner* — Duane N Taylor, Jr.
(74) *Attorney, Agent, or Firm* — Calfee, Halter & Griswold LLP

(57) ABSTRACT

A display panel includes a driving backplane, a light-emitting layer, a lens layer, and a cover plate. The light-emitting layer is arranged on a side of the driving backplane and includes a plurality of light-emitting devices. The lens layer is arranged on a side of the light-emitting layer away from the driving backplane and includes a plurality of lens groups. One lens group is arranged corresponding to at least one light-emitting device. The lens group includes a central lens and a peripheral lens surrounding the central lens. The central lens and the peripheral lens include an inner light-transmissive area and an outer light-transmissive area surrounding the inner light-transmissive area. The refractive index of the inner light-transmissive area is greater than that of the outer light-transmissive area in the same lens group. The cover plate is arranged on a side of the lens layer away from the driving backplane.

20 Claims, 7 Drawing Sheets

(56)　　　　　References Cited

U.S. PATENT DOCUMENTS

| 2021/0384473 A1 | 12/2021 | Zhang et al. |
| 2022/0140292 A1 | 5/2022 | Zhang et al. |

FOREIGN PATENT DOCUMENTS

| CN | 104282715 | A | | 1/2015 |
| CN | 105977786 | A | | 9/2016 |
| CN | 209785979 | U | | 12/2019 |
| CN | 111370588 | A | | 7/2020 |
| CN | 111613628 | A | | 9/2020 |
| CN | 111697037 | A | | 9/2020 |
| CN | 113314680 | A | | 8/2021 |
| CN | 113629214 | A | | 11/2021 |
| CN | 215174228 | U | * | 12/2021 |
| JP | 2010020237 | A | | 1/2010 |
| JP | 2015215388 | A | | 12/2015 |
| KR | 20060114086 | A | | 11/2006 |
| KR | 100712291 | B1 | | 4/2007 |

* cited by examiner

DISPLAY PANEL AND DISPLAY DEVICE

CROSS REFERENCE TO RELATED APPLICATION(S)

The present disclosure is a 35 U.S.C. 371 national phase application of PCT International Application No. PCT/CN2022/086394 filed on Apr. 12, 2022, the entire disclosure of which is incorporated herein as a part of the present application for all purposes.

TECHNICAL FIELD

The present disclosure relates to the field of display technology, and in particular, to a display panel and a display device.

BACKGROUND

Display panels are an integral part of electronic devices such as mobile phones and computers, and include liquid crystal display panels, organic electroluminescent display panels, and the like. At present, people have higher and higher requirements on display effects, but the brightness of existing display panels still needs to be improved.

It should be noted that the information disclosed in the Background section is only used for enhancing the understanding of the background of the present disclosure, and therefore may include information that does not constitute the prior art known to those of ordinary skills in the art.

SUMMARY

The present disclosure provides a display panel and a display device.

According to an aspect of the present disclosure, there is provided a display panel, including:

a driving backplane;

a light-emitting layer, arranged on a side of the driving backplane and including a plurality of light-emitting devices arranged in an array;

a lens layer, arranged on a side of the light-emitting layer away from the driving backplane, and including a plurality of lens groups arranged in an array, where one of the lens groups is arranged corresponding to at least one of the light-emitting devices, the lens group includes a central lens and at least one peripheral lens surrounding the central lens, each of the central lens and the peripheral lens includes an inner light-transmissive area and an outer light-transmissive area fitting and surrounding the inner light-transmissive area, and the refractive index of the inner light-transmissive area is greater than the refractive index of the outer light-transmissive area in the same lens group; and a cover plate, arranged on a side of the lens layer away from the driving backplane.

In an exemplary embodiment of the present disclosure, the display panel further includes:

a touch electrode layer, arranged on a side of the light-emitting layer away from the driving backplane.

The lens layer covers the touch electrode layer.

In an exemplary embodiment of the present disclosure, the touch electrode layer is a mesh structure having a plurality of mesh holes and formed by connecting a plurality of channel lines; the orthographic projection on the driving backplane of at least one lens group is located within the orthographic projection on the driving backplane of one of the mesh holes; and the orthographic projection on the driving backplane of one light-emitting device is located within the orthographic projection on the driving backplane of one lens group.

In an exemplary embodiment of the present disclosure, the width of the channel line is smaller than the distance between two adjacent lens groups, and the orthographic projection on the driving backplane of the channel line is located outside of the orthographic projection on the driving backplane of the lens group.

In an exemplary embodiment of the present disclosure, the display panel further includes:

an encapsulation layer, covering the light-emitting layer;

a buffer layer, covering the encapsulation layer;

a transfer layer, arranged on the surface of the buffer layer away from the driving backplane, and including a plurality of transfer bridges; and an isolation layer, covering the transfer layer.

The touch electrode layer is disposed on the surface of the isolation layer away from the driving backplane. The touch electrode layer includes a plurality of first electrode blocks and second electrode blocks. The first electrode blocks are connected by the transfer bridges to form a plurality of first touch electrodes. The second electrode blocks are connected to form a plurality of second touch electrodes intersecting with the first touch electrodes.

In an exemplary embodiment of the present disclosure, the lens layer further includes:

a spacer, provided on the same layer as each lens group and used for separating each lens group, where one of the inner light-transmissive area and the outer light-transmissive area is made of the same material as the spacer.

In an exemplary embodiment of the present disclosure, the lens layer further includes:

a cover layer, covering the lens groups and the spacer, where the cover layer, the spacer and the inner light-transmissive area are integrally structured.

In an exemplary embodiment of the present disclosure, the lens layer further includes:

a cover layer, covering the lens groups and the spacer, where the cover layer, the spacer and the outer light-transmissive area are integrally structured.

In an exemplary embodiment of the present disclosure, the boundary of the orthographic projection on the driving backplane of the light-emitting device coincides with the inner boundary of the orthographic projection on the driving backplane of the outer light-transmissive area of the respective central lens.

In an exemplary embodiment of the present disclosure, the orthographic projections on the driving backplane of the light-emitting device and the inner light-transmissive area and the outer light-transmissive area of the respective lens group are the same in shape.

In an exemplary embodiment of the present disclosure, among one of the light-emitting devices and the respective lens group, the boundary of the orthographic projection on the driving backplane of the light-emitting device is in the shape of polygon, the boundary of the orthographic projection on the driving backplane of the inner light-transmissive area of the central lens is in the shape of polygon, and the outer boundary of the orthographic projection on the driving backplane of the inner light-transmissive area of the peripheral lens is in the shape of polygon;

each side of the boundary of the orthographic projection on the driving backplane of the light-emitting device is parallel to or coincides with the respective side of the inner boundary of the orthographic projection on the driving backplane of the outer light-transmissive area of the central lens; and each side of the boundary of the orthographic projection on the driving backplane of the light-emitting device is parallel to the respective side of the outer boundary of the orthographic projection on the driving backplane of the inner light-transmissive area of the peripheral lens.

In an exemplary embodiment of the present disclosure, the display panel further includes:

a color filter layer, arranged on the side of the lens layer away from the driving backplane, and including color resists each corresponding to a respective one of the light-emitting devices.

In an exemplary embodiment of the present disclosure, the inner peripheral surface of each of the outer light-transmissive areas is a slope surface expanding in a direction away from the driving backplane.

In an exemplary embodiment of the present disclosure, the width between the inner boundary and the outer boundary of the orthographic projection on the driving backplane of the outer light-transmissive area is greater than or equal to 2 µm and less than or equal to 3 µm.

In an exemplary embodiment of the present disclosure, the slope angle of the slope surface is greater than or equal to 50° and less than or equal to 90°.

In an exemplary embodiment of the present disclosure, the refractive index of the inner light-transmissive area is greater than or equal to 1.6 and less than or equal to 1.75; and the refractive index of the outer light-transmissive area is greater than or equal to 1.4 and less than or equal to 1.55.

According to another aspect of the present disclosure, a display device is provided, including the display panel described in any one of the above embodiments.

It is to be understood that both the foregoing general description and the following detailed description are exemplary and explanatory only, and are not restrictive of the present disclosure.

BRIEF DESCRIPTION OF THE DRAWINGS

The accompanying drawings, which are incorporated in and constitute a part of the specification, illustrate embodiments consistent with the present disclosure and together with the description serve to explain the principles of the present disclosure. Apparently, the drawings in the following description are only some embodiments of the present disclosure, and those skilled in the art can obtain other drawings according to these drawings without creative efforts.

DETAILED DESCRIPTION OF THE EMBODIMENTS

Figure 1:
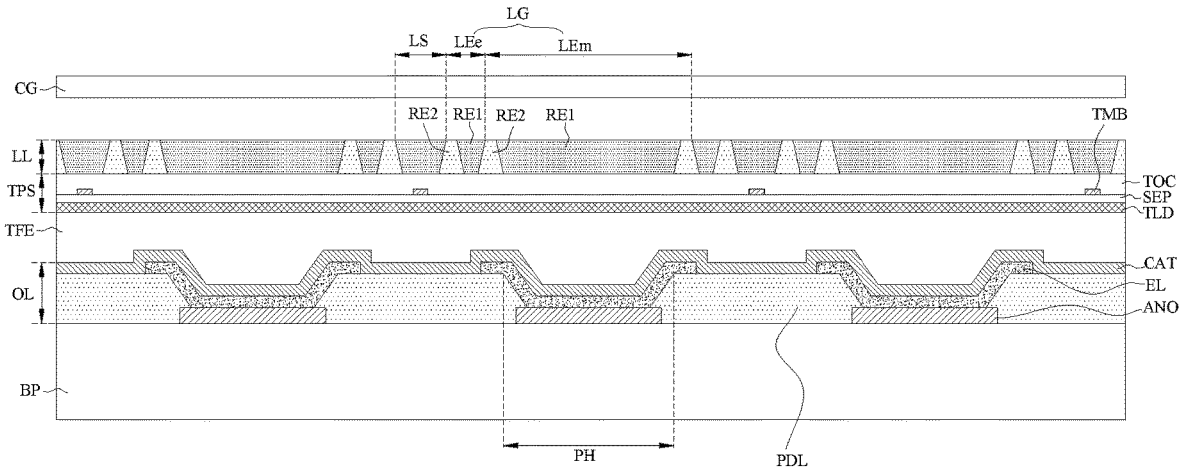
FIG. 1 is a partial cross-sectional view of the display panel according to Embodiment 1 of the present disclosure.

Example embodiments will now be described more fully with reference to the accompanying drawings. Example embodiments may, however, be embodied in many forms and should not be construed as limited to the embodiments set forth herein. Rather, these embodiments are provided so that the present disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

The terms "a", "an", "the", "said" and "at least one" are used to indicate the presence of one or more elements or components, etc. The terms "comprising" and "have" are used to indicate non-exclusive inclusion, and means that there may be additional elements or components, etc. in addition to the listed elements or components, etc. The terms "first", "second" and so on are used as labels, but not as any limitation on the number of the relevant objects.

The row direction X and the column direction Y herein are only two directions perpendicular to each other. In the drawings of the present disclosure, the row direction X may be horizontal, and the column direction Y may be vertical, but it is not limited thereto. If rotation of the display panel occurs, the actual orientations of the row direction X and the column direction Y may change. In the drawings, the X direction exemplarily shows the row direction, and the Y direction exemplarily shows the column direction.

In related technologies, an organic electroluminescent display panel may include a driving backplane and a plurality of light-emitting devices located on one side of the driving backplane. Each light-emitting device may be an OLED, and the light-emitting devices may be controlled through the driving backplane to emit light independently for realizing image display. At the same time, the display panel also includes a cover plate made of transparent material such as glass, and the cover plate may cover the side of the light-emitting devices away from the driving backplane for protection. The light emitted by the light-emitting devices is emitted out from the cover plate into the air outside the display panel. Because the refractive index of the cover plate is greater than that of air, when the light enters the air from the cover plate, the light whose incident angle reaches the critical angle of total reflection will be totally reflected at the interface between the cover plate and the air. This causes part of the light not being able to exit from the cover plate, making the light extraction efficiency of the display panel to be low, which affects the brightness. In this process, the larger the incident angle of the light irradiated to the cover plate, the easier it is for total reflection to occur.

An embodiment of the present disclosure provides a display panel. As shown in FIG. 1, the display panel may include a driving backplane BP, a light-emitting layer OL, a lens layer LL, and a cover plate CG.

The light-emitting layer OL is arranged on one side of the driving backplane BP, and includes a plurality of light-emitting devices arranged in an array. The lens layer LL is arranged on the side of the light-emitting layer OL away from the driving backplane BP, and includes a plurality of lens groups LG arranged in an array. A lens group LG is arranged corresponding to a light-emitting device. The lens group LG includes a central lens LEm and at least one peripheral lens LEe surrounding the central lens LEm. Each of the central lens LEm and the peripheral lens LEe includes an inner light-transmissive area RE1 and an outer light-transmissive area RE2 that fits and surrounds the inner light-transmissive area RE1. In the same lens group LG, the refractive index of the inner light-transmissive area RE1 is greater than the refractive index of the outer light-transmissive area RE2. The cover plate CG is arranged on a side of the lens layer LL away from the driving backplane BP.

Figure 2:
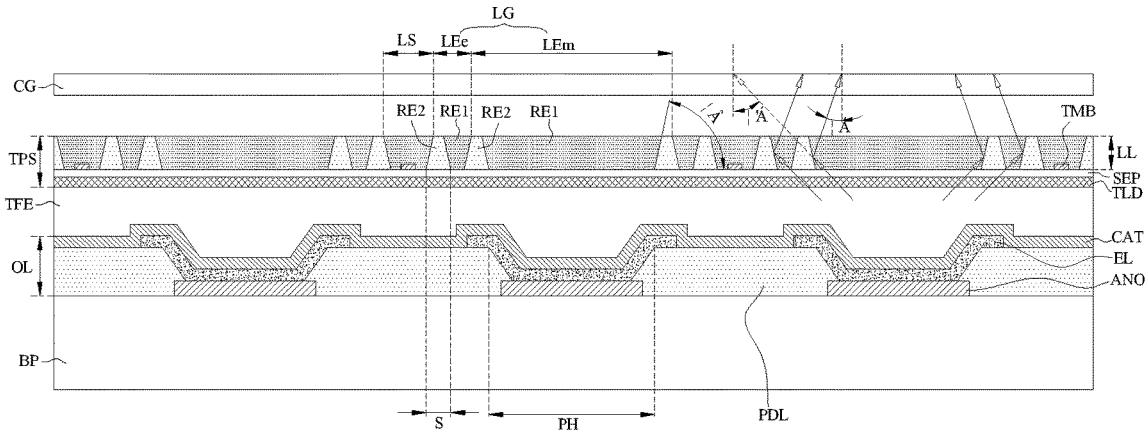
FIG. 2 is a partial cross-sectional view of the display panel according to Embodiment 2 of the present disclosure.
Figure 6:
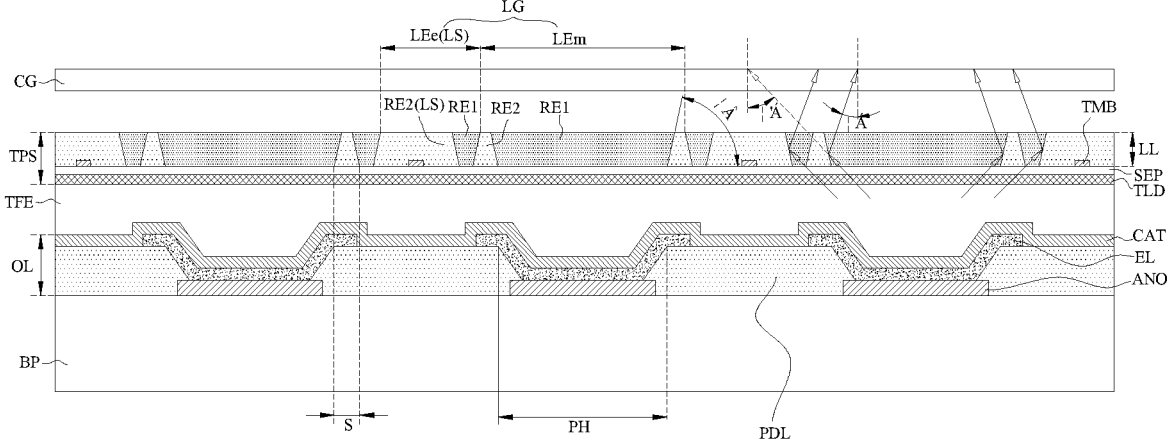
FIG. 6 is a partial cross-sectional view of the display panel according to Embodiment 5 of the present disclosure.

In the display panel according to embodiment of the present disclosure, the light emitted by the light-emitting device may propagate in a direction away from the driving backplane BP, and the light may be totally reflected by the lens group LG and thus become converged, so that the incident angle of the light emitted out from the cover plate CG becomes smaller. As shown in FIG. 2 and FIG. 6, the incident angle α is smaller than α'. Therefore, as compared with the case without lens group LG, it is not easy for total reflection to occur when the light is emitted out from the cover plate CG. This is beneficial to improve the light extraction efficiency, and helps to increase brightness without increasing the power consumption. Specifically, because the refractive index of the inner light-transmissive area RE1 is greater than that of the outer light-transmissive area RE2, total reflection of the light incident on the inner light-transmissive area RE1 may occur at the interface where the inner light-transmissive area RE1 contacts with the outer light-transmissive area RE2. At the same time, the central lens LEm and the peripheral lens LEe of the lens group LG may be used to totally reflect part of the light emitted by the corresponding light-emitting device, so that the propagation direction of more light can be converged due to total reflection, which is beneficial to further improve the light extraction efficiency.

In addition, even if part of the light is not totally reflected at the interface between the inner light-transmissive area RE1 and the outer light-transmissive area RE2, since the refractive index of the inner light-transmissive area RE1 is greater than the refractive index of the outer light-transmissive area RE2, the light propagation direction converges after refraction at the interface between the inner light-transmissive area RE1 and the outer light-transmissive area RE2, which also helps to reduce the incident angle at the cover plate CG, thereby improving the light extraction efficiency.

The following is a detailed description of the display panel according to embodiments of the present disclosure.

As shown in FIG. 1, the driving backplane BP has a driving circuit, which is configured to drive the light-emitting device to emit light for image display.

The driving backplane BP may include a substrate and a circuit layer on one side of the substrate. The substrate may be a flat plate structure, and its material may be hard materials such as glass, or soft materials such as polyimide. Meanwhile, the substrate may be a single-layer or multi-layer structure.

The circuit layer may be arranged on one side of the substrate, and the circuit layer may include a driving circuit, through which the light-emitting device can be driven to emit light. For example, the display panel may be at least divided into a display area and a peripheral area located outside the display area. Accordingly, the area where the circuit layer is located in the display area is the pixel area, and the area located in the peripheral area is the edge area. That is, the edge area is located outside the pixel area. The driving circuit may include a pixel circuit located in the pixel area and a peripheral circuit located in the edge area. The pixel circuit may be a pixel circuit such as 7T1C, 7T2C, 6T1C, or 6T2C, as long as it can driving the light-emitting device to emit light, structures of which will not be specially defined herein. The number of pixel circuits may be the same as the number of light-emitting devices, and each pixel circuit is connected to a respective light-emitting device in one-to-one correspondence, so as to control each light-emitting device to emit light. nTmC indicates that a pixel circuit includes n transistors (indicated by the letter "T") and m capacitors (indicated by the letter "C"). Apparently, the same pixel circuit may also be connected with multiple light-emitting devices, and may simultaneously drive the multiple light-emitting devices to emit light, which is not specifically limited herein.

The peripheral circuit is connected with the pixel circuit and is used for inputting a driving signal to the pixel circuit, so as to control the light-emitting device to emit light. The peripheral circuit may include a gate driving circuit and a light emission control circuit, and apparently may also include other circuits. The specific structure of the peripheral circuit is not specifically limited herein.

The above-mentioned circuit layer may include a plurality of thin film transistors and capacitors. The thin film transistors may be top-gate or bottom-gate type of thin film transistors. Each thin film transistor may include an active layer and a gate. The active layer of each thin film transistor is arranged in the same semiconductor layer, and the gate of each thin film transistor is arranged in the same gate layer, so as to simplify processing.

Taking the top-gate type of thin film transistor as an example, the circuit layer may include a semiconductor layer, a first gate insulation layer, a first gate layer, a second gate insulation layer, a second gate layer, an interlayer dielectric layer, a first source-drain layer, a passivation layer, a first planarization layer, a second source-drain layer, and a second planarization layer stacked in sequence. The specific patterns of each film layer depend on the specific composition of the driving circuit, and are not specifically limited herein.

As shown in FIG. 1, the light-emitting layer OL is arranged on one side of the driving backplane BP, and includes a light-emitting device and a pixel definition layer PDL for defining the range of the light-emitting device. For example, the pixel definition layer PDL and the light-emitting device may be arranged on the surface of the second planarization layer away from the substrate. The orthographic projection of each light-emitting device on the circuit layer may be located in the pixel area, i.e., in the display area of the display panel, and no light-emitting device is provided in the edge area. Each light-emitting device may include a first electrode ANO and a second electrode CAT, as well as a light-emitting material layer EL between the first electrode ANO and the second electrode CAT. By applying an electrical signal to the first electrode ANO and the second electrode CAT, the light-emitting material layer EL may be excited to emit light. The light-emitting device may be an organic light-emitting diode (OLED).

As shown in FIG. 1, the first electrodes ANO of the light-emitting devices are arranged at intervals, and the pixel definition layer PDL is provided with openings PH for exposing the first electrode ANOs. That is, one opening PH exposes one first electrode ANO. The pixel definition layer PDL may be used to define the range of each light-emitting device. The range corresponding to an opening PH is the range of a light-emitting device. The boundary of the orthographic projection on the driving backplane BP of the light-emitting device is the boundary of the orthographic projection on the driving backplane BP of the opening PH. If the sidewall of the opening PH is a slope surface expanding in a direction away from the driving backplane BP, the orthographic projection of the light-emitting device on the driving backplane BP is the outer boundary of the orthographic projection of the opening PH on the driving backplane BP. The shape of the opening PH, that is, the shape of the boundary of the orthographic projection on the driving backplane BP of the opening PH, may be a polygon such as rectangle, pentagon, or hexagon, or an ellipse, a sector, or other shapes. The shape is specially limited herein.

The light-emitting material layer EL is at least partly located in the opening PH and stacked with the first electrode ANO. The light-emitting material layer EL may include a hole injection layer, a hole transport layer, a light-emitting material layer, an electron transport layer, and an electron injection layer sequentially stacked in a direction away from the driving backplane BP. Apparantly, other structures may also be used, as long as they can cooperate with the first electrode ANO and the second electrode CAT for light emission.

The second electrode CAT may cover the light-emitting material layer EL, and the second electrode CAT may be a continuous layer structure, so that each light-emitting device may share the same second electrode CAT. The second electrode CAT may be recessed into the opening PH at a position corresponding to the opening PH. At the same time, the second electrode CAT may be the cathode of the light-emitting device, which may adopt a light-transmissive structure, so that the light-emitting device can emit light in a direction away from the driving backplane BP. For example, the material of the second electrode CAT may be metal magnesium, silver or alloys thereof, etc. With a certain thickness, the second electrode CAT may transmit light while in an electrically conductive state. At the same time, the first electrode ANO may have an opaque structure, so that the light-emitting device has a top emission structure.

The second electrode CAT may extend to the edge area of the circuit layer, and is connected with a common power signal line for receiving the common power signal. The common power signal line may be arranged on the same layer as the first electrode ANO. Thus, the second electrode CAT may be in the edge area and connected to the common power signal line. When displaying images, a pixel power signal may be applied to the first electrode ANO under the control by the pixel circuit, and the pixel circuit may receive the pixel power signal through the pixel power line located in the second source-drain layer, and send the common power signal to the second electrode CAT through the common power signal line. Thus, the light-emitting layer OL is excited to emit light. The specific principle of organic electroluminescence will not be described in detail herein.

In some embodiments of the present disclosure, as shown in FIG. 1, each light-emitting device may emit light independently, and the light emission colors of different light-emitting devices may be different. Specifically, the light-emitting material layer EL may include multiple light-emitting units which are arranged at intervals in the openings PH in one-to-one correspondence. Each light-emitting unit may emit light independently, and the light emission colors may be different, so that color display can be directly realized.

Figure 9:
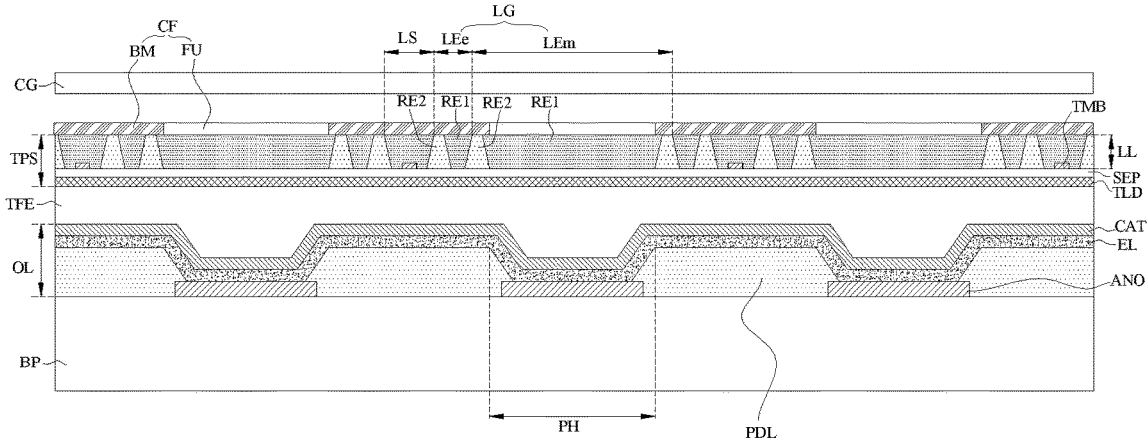
FIG. 9 is a partial cross-sectional view of the display panel according to Embodiment 7 of the present disclosure.

In some embodiments of the present disclosure, as shown in FIG. 9, the light-emitting material layer EL may also cover the pixel definition layer PDL and each first electrode ANO at the same time. That is, each light-emitting device may share the same light-emitting material layer EL. At this time, light emission colors of the light-emitting devices are the same. In order to realize color display, a color filter layer CF may be arranged on the side of the light-emitting device away from the driving backplane BP. The color filter layer CF includes a plurality of color resists FU, and each color resist FU corresponds to a respective light-emitting device. Colors of different color resists FU may be different, and each color resist FU may only transmit a specific kind of monochromatic light, so that color display can be realized through the color filter layer CF. In addition, the color filter layer CF may further include a light-absorbing portion BM, and each color resist FU may be separated by the light-absorbing portion BM.

In some embodiments of the present disclosure, for the case that the light-emitting material layer EL includes a plurality of light-emitting units that can independently emit monochromatic light, a color filter layer may still be provided on the side of the light-emitting device away from the driving backplane BP. Each color resist of the color filter layer helps to filter out at least part of the light that enters the display panel from outside and is reflected by structures such as the first electrode ANO and the second electrode CAT, so as to achieve the purpose of reducing the reflection of ambient light.

In some embodiments of the present disclosure, as shown in FIG. 1, the display panel may further include an encapsulation layer TFE. The encapsulation layer TFE may cover each light-emitting device, and be used to protect the light-emitting layer OL, thereby preventing external water and oxygen from corroding the light-emitting device. For example, the encapsulation layer TFE may adopt the method of thin film encapsulation, and may include a first inorganic layer, an organic layer, and a second inorganic layer.

The first inorganic layer may cover each light-emitting device. That is, the first inorganic layer may cover the surface of the second electrode CAT away from the driving backplane BP. The material of the first inorganic layer may include inorganic insulation materials such as silicon nitride and silicon oxide.

The organic layer may be disposed on the surface of the first inorganic layer away from the driving backplane BP. The boundary of the organic layer may be limited to the inner side of the boundary of the first inorganic layer by a barrier dam located in the peripheral area. The boundary of the orthographic projection of the organic layer on the driving backplane BP may be located in the peripheral area, thereby ensuring that the organic layer can cover each light-emitting device.

The second inorganic layer may cover the organic layer and the first inorganic layer not covered by the organic layer. The second inorganic layer helps to block the intrusion of water and oxygen. The flexible organic layer helps to realize planarization. The material of the second inorganic layer may include inorganic insulation materials such as silicon nitride and silicon oxide. It should be noted that the color filter layer mentioned in some embodiments above may be disposed on the side of the encapsulation layer TFE away from the driving backplane BP.

In some embodiments of the present disclosure, as shown in FIG. 1, the display panel may further include a touch layer TPS, which may be disposed on the side of the encapsulation layer TFE away from the driving backplane BP, and used for sensing touch operations. The following is an example illustration for the solution of touch control.

Figures 10, 11:
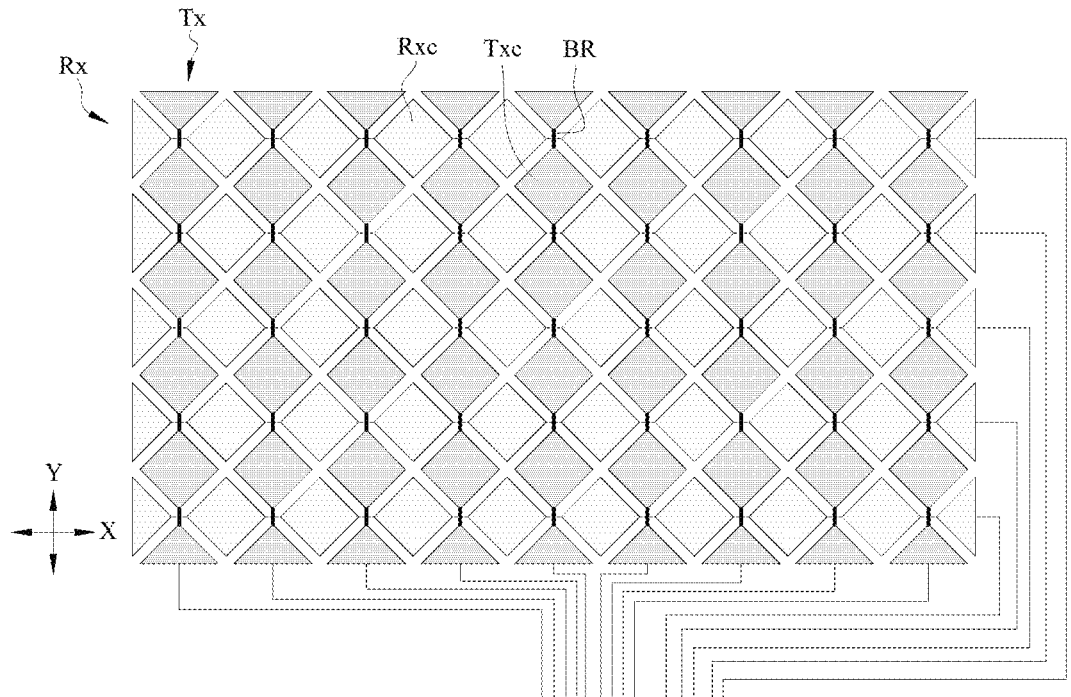
FIG. 10 is a schematic top view of the touch layer in the display panel according to an embodiment of the present disclosure.
FIG. 11 is a schematic cross-sectional view of a touch layer in the display panel according to an embodiment of the present disclosure.

Taking the touch layer TPS adopting a mutual capacitive touch structure as an example, as shown in FIG. 10 and FIG. 11, the touch layer TPS may include a plurality of first touch electrodes Tx and a plurality of second touch electrodes Rx. The first touch electrodes Tx may be arranged along the row direction X at intervals. A first touch electrode Tx may include a plurality of first electrode blocks Txc arranged along the column direction Y at intervals and transfer bridges BR connecting two adjacent first electrode blocks Txc. The second touch electrodes Rx may be arranged at intervals along the column direction Y. A second touch electrode Rx includes a plurality of second electrode blocks Rxc connected in series along the row direction X. A transfer bridge BR intersects with and is further insulated from a second touch electrode Rx. One of the first touch electrode Tx and the second touch electrode Rx may be used as a transmitting electrode, and the other may be used as a receiving electrode, both of which are connected to a peripheral touch driving circuit.

The first electrode block Txc and the second touch electrode Rx as mentioned above are located on the touch electrode layer TMB. That is, the first electrode block Txc and the second touch electrode Rx are arranged in the same layer, so that they can be formed simultaneously through the same process. The transfer bridge BR may be located in the transfer layer, which may be located between the touch electrode layer TMB and the encapsulation layer TFE. In addition, the touch layer TPS may also include a buffer layer TLD and an isolation layer SEP.

The buffer layer TLD may be disposed on the surface of the encapsulation layer TFE away from the driving backplane BP, and materials of the buffer layer TLD may be silicon nitride, silicon oxide, and other insulation materials, which are not specifically limited herein. The transfer layer may be disposed on the surface of the buffer layer TLD away from the driving backplane BP, and includes a plurality of transfer bridges BR arranged in an array. The transfer layer may be made of metal or other conductive materials. The isolation layer SEP may cover the transfer layer, and the material of the isolation layer SEP may be insulation materials such as silicon nitride and silicon oxide, which are not specifically limited herein. The touch electrode layer TMB may be disposed on the surface of the isolation layer SEP away from the driving backplane BP, and includes the first electrode block Txc and the second touch electrode Rx as mentioned above.

Taking the touch layer TPS adopting a self-capacitive touch structure as an example, the touch layer TPS may include a buffer layer TLD and a touch electrode layer TMB. The buffer layer TLD may be disposed on the surface of the encapsulation layer TFE away from the driving backplane BP, and the material of the buffer layer TLD may be silicon nitride, silicon oxide, or other insulation materials, which are not specifically limited herein. The touch electrode layer TMB may include a plurality of electrode blocks arranged in an array, and each electrode block may be connected to a peripheral touch driving circuit through an independent wire.

Figure 3:
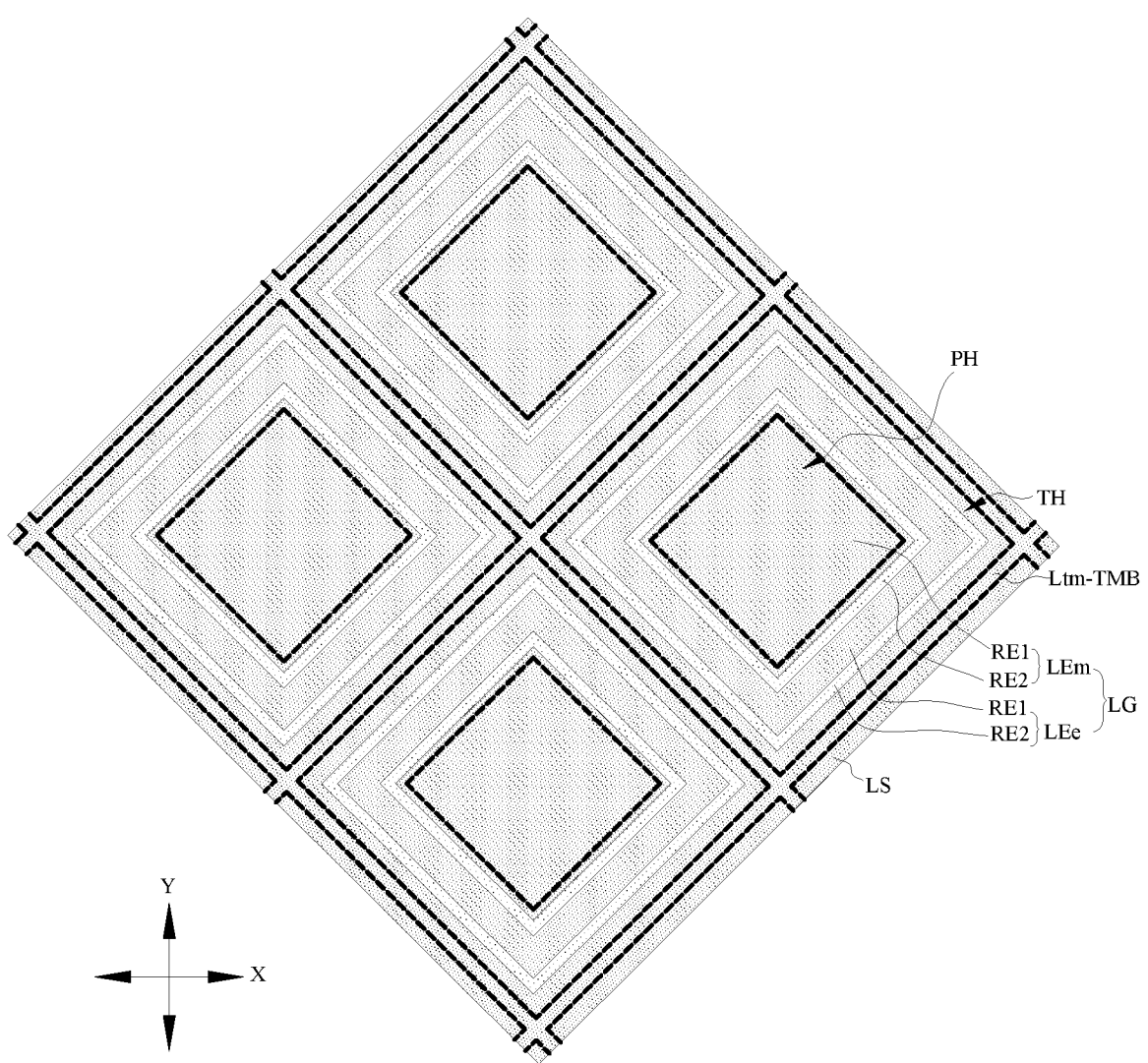
FIG. 3 is a partial top view of the display panel in FIG. 2.

As shown in FIGS. 1-3, in order to improve light transmittance and reduce the shielding of the light-emitting device by the touch electrode layer TMB, the touch electrode layer TMB may be a mesh structure formed by connecting a plurality of channel lines Ltm. The mesh structure has a plurality of mesh holes TH. One light-emitting device may correspond to one mesh hole TH. That is, the orthographic projection of a light-emitting device on the driving backplane BP is located within the orthographic projection of a mesh hole TH on the driving backplane BP. In some embodiments of the present disclosure, one mesh hole TH may correspond to only one light-emitting device, and the shape of the mesh hole TH may be the same as that of the light-emitting device. Apparently, in other embodiments of the present disclosure, one mesh hole TH may also correspond to multiple light-emitting devices.

In some embodiments of the present disclosure, as shown in FIG. 1, the display panel may also cover the touch electrode layer TMB with a protective layer TOC, and the touch electrode layer TMB may be protected and planarized by the protective layer TOC, so as to form film layer above the touch layer TPS. As shown in FIG. 1, FIG. 2 to FIG. 6, the lens layer LL may be arranged on the side of the light-emitting layer OL away from the driving backplane BP, and includes a plurality of lens groups LG arranged in an array. Each lens group LG may be arranged corresponding to a light-emitting device. The light emitted by the corresponding light-emitting device may be converged through the lens group LG, so as to improve the light extraction efficiency. Specifically, the lens group LG may include a central lens LEm and at least one peripheral lens LEe surrounding the central lens LEm. The peripheral lens LEe may be in a ring structure. If the number of peripheral lenses LEe is two or more, the size of each peripheral lens LEe is different, the peripheral lenses LEe may surround the central lens LEm in sequence from inside to outside, and centers of the orthographic projections of the central lens LEm and the peripheral lens LEe on the driving backplane BP may coincide. That is, the central lens LEm and the peripheral lens LEe are in a concentric setup.

Each of the central lens LEm and the peripheral lens LEe includes an inner light-transmissive area RE1 and an outer light-transmissive area RE2 surrounding the inner light-transmissive area RE1. The inner light-transmissive area RE1 and the outer light-transmissive area RE2 of the peripheral lens LEe are ring structures. The outer light-transmissive area RE2 is bonded to the outer peripheral surface of the inner light-transmissive area RE1. That is, the inner peripheral surface of the outer light-transmissive area RE2 is bonded to the outer peripheral surface of the inner light-transmissive area RE1 to form an interface between the two. In the same lens group LG, the materials of the inner light-transmissive area RE1 and the outer light-transmissive area RE2 are different, and the refractive index of the inner light-transmissive area RE1 is greater than the refractive index of the outer light-transmissive area RE2. For example, two simple materials with different refractive indices may be directly used to form the inner light-transmissive area RE1 and the outer light-transmissive area RE2. Alternatively, the same simple material may be used as the base material, and reflective particles may be added into the base material for adjusting the refractive index, thereby obtaining two materials with different refractive indices. There is no special limitation on the specific material herein, as long as the light transmission can be realized and the refractive index of the inner light-transmissive area RE1 can be greater than the refractive index of the outer light-transmissive area RE2.

In some embodiments of the present disclosure, the refractive index of the inner light-transmissive area RE1 is not less than 1.6 and not more than 1.75, that is, greater than or equal to 1.6 and less than or equal to 1.75. The refractive index of the outer light-transmissive area RE2 is not less than 1.4 and not more than 1.55, that is, greater than or equal to 1.4 and less than or equal to 1.55. For example, the refractive index of the inner light-transmissive area RE1 is 1.7, and the refractive index of the outer light-transmissive area RE2 is 1.47. The critical angle at which light is totally reflected at the interface between the outer light-transmissive area RE2 and the inner light-transmissive area RE1 is 59.8°.

As shown in FIG. 2 and FIG. 6, when the light emitted by the light-emitting device passes through the inner light-transmissive area RE1 and irradiates at the interface between the inner light-transmissive area RE1 and the outer light-transmissive area RE2, the light whose incident angle reaches the critical angle of total reflection will be totally reflected, thereby not entering the outer light-transmissive area RE2. The light emitted by the light-emitting device may be converged as compared with the emission angle out from the opening PH.

In some embodiments of the present disclosure, as shown in FIG. 2 and FIG. 6, the boundary of the orthographic projection of the light-emitting device on the driving backplane BP coincides with the boundary of the orthographic projection on the driving backplane BP of the outer light-transmissive area RE2 of the respective central lens LEm. That is, the interface connecting the inner light-transmissive area RE1 and the outer light-transmissive area RE2 of the central lens LEm coincides with the outer boundary of the orthographic projection of the opening PH on the driving backplane BP. Thus, the interface at which total reflection occurs has the smallest distance from the light-emitting device in a direction parallel to the driving backplane, without blocking the light-emitting device. In this case, more light can enter the lens group LG, thereby maximizing the light extraction efficiency. Apparently, the boundary of the orthographic projection of the light-emitting device on the driving backplane BP may also be located inside the boundary of the orthographic projection on the driving backplane BP of the inner light-transmissive area RE1 of the respective central lens LEm.

It should be noted that the wording "coincide" in the present application is not limited to absolute coincidence. Within the error range of manufacture and measurement, there may be reasonable deviations for multiple elements that have a coincident relationship, and non-absolute coincidence also fall with the scope of the present application. For example, if it is recited that the boundary of the orthographic projection of the light-emitting device on the driving backplane BP coincides with the boundary of the orthographic projection on the driving backplane BP of the outer light-transmissive area RE2 of the respective central lens LEm, at least two cases are included, one indicating a complete coincidence of the two, and the other indicating a non-overlapping area present between the two boundaries due to manufacturing errors and the like.

The inner peripheral surface of each outer light-transmissive area RE2 is a slope surface that expands in a direction away from the driving backplane BP. That is, the top end of the slope surface extends to the side of the bottom section thereof away from the center of the outer light-transmissive area RE2. The slope angle β of the slope surface is equal to the angle between the extension surface of the slope surface and the substrate, and the slope angle β is not less than 50° and not more than 90°. For example, the slope angle β is 50°, 55°, 60°, 70°, 80°, or 90°, etc. With experimental analysis, when the slope angle β is 55° or approximately 55°, the improvement in light extraction efficiency may be maximized. At the same time, the outer peripheral surface of the outer light-transmissive area RE2 may be a slope surface expanding in a direction away from the driving backplane BP. That is, the top end of the slope surface extends to the side of the bottom end thereof away from the center of the outer light-transmissive area RE2. Thus, the outline of the cross section perpendicular to the driving backplane BP of the outer light-transmissive area RE2 is trapezoidal, and the trapezoidal shape may be an isosceles trapezoidal shape. The bottom end of the aforementioned slope surface is an end closer to the driving backplane BP, and the top end is an end farer away from the driving backplane BP.

As shown in FIG. 2 and FIG. 6, the width S between the inner boundary and the outer boundary of the orthographic projection of the outer light-transmissive area RE2 on the driving backplane BP is not less than 2 μm and not more than 3 μm, that is, greater than or equal to 2 μm and less than or equal to 3 μm, for example, 2 μm, 2.5 μm or 3 μm, etc. The width S is the maximum distance between the inner peripheral surface and the outer peripheral surface of the outer light-transmissive area RE2.

Figure 7:
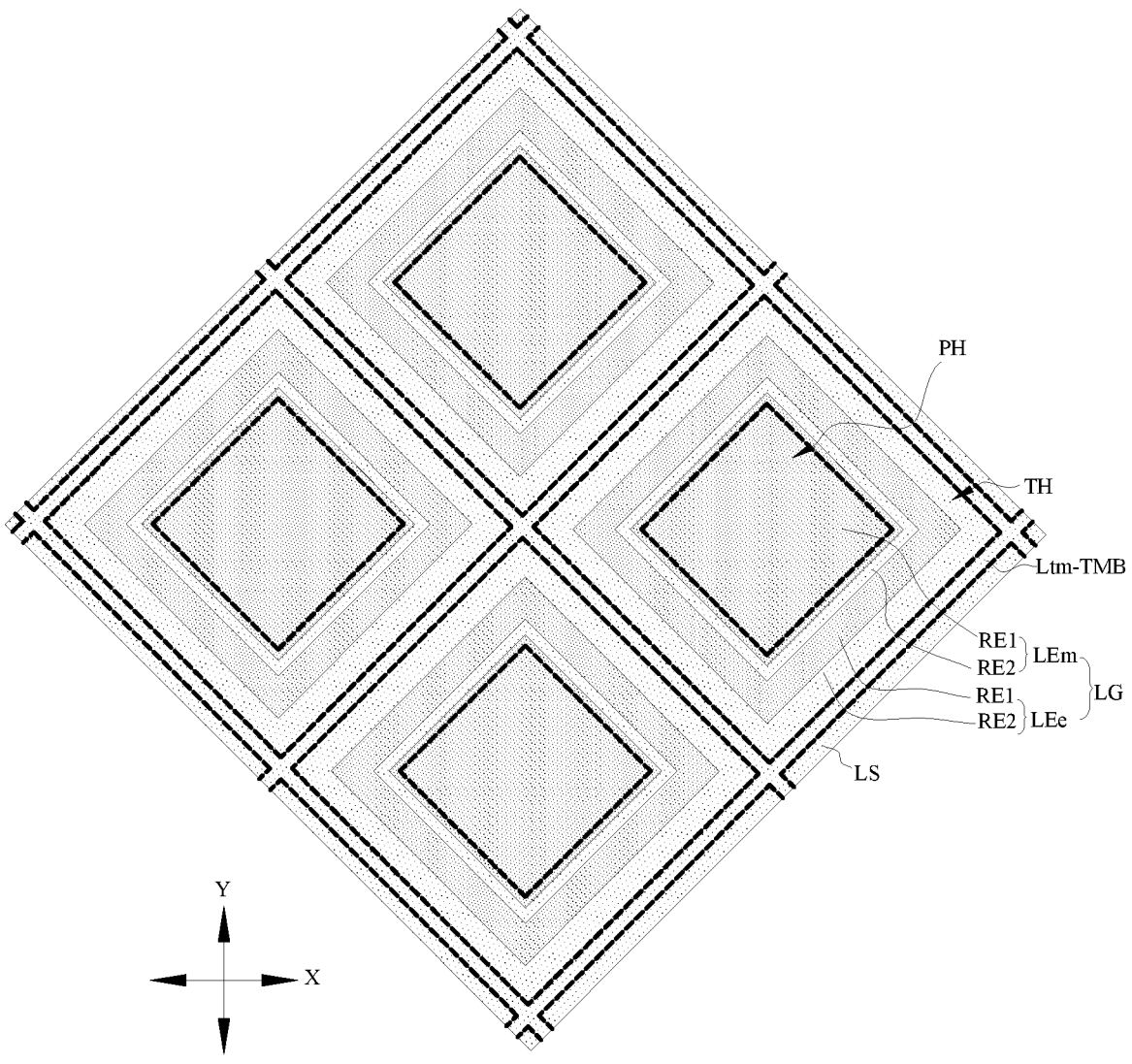
FIG. 7 is a partial top view of the display panel in FIG. 6.

In some embodiments of the present disclosure, as shown in FIG. 3 and FIG. 7, orthographic projections on the driving backplane BP of the light-emitting device and the inner light-transmissive area RE1 and the outer light-transmissive area RE2 of the respective lens group LG are the same in shape. The shape of the orthographic projection on the driving backplane BP of the inner light-transmissive area RE1 of the central lens LEm is the shape of the boundary of such orthographic projection. The shape of the orthographic projection of the outer light-transmissive area RE2 on the driving backplane BP is the shape of the inner boundary of such orthographic projection.

For example, as shown in FIG. 3 and FIG. 7, among a light-emitting device and the respective lens group LG, the boundary of the orthographic projection of the light-emitting device on the driving backplane BP is in the shape of polygon. The boundary of the orthographic projection on the driving backplane BP of the inner light-transmissive area RE1 of the central lens LEm is in the shape of polygon. The outer boundary of the orthographic projection on the driving backplane BP of the inner light-transmissive area RE1 of the peripheral lens LEe is in the shape of polygon. The polygon may be a rectangle, a rhombus, a hexagon, etc., and there is no special limitation herein.

Each side of the boundary of the orthographic projection of the light-emitting device on the driving backplane BP is parallel to a respective side of the inner boundary of the orthographic projection of the outer light-transmissive area RE2 of the central lens LEm on the driving backplane BP. Alternatively, the boundary of the orthographic projection of the light-emitting device on the driving backplane BP may coincide with the inner boundary of the orthographic projection of the outer light-transmissive area RE2 of the central lens LEm on the driving backplane BP.

Each side of the boundary of the orthographic projection of the light-emitting device on the driving backplane BP is parallel to a respective side of the outer boundary of the orthographic projection of the inner light-transmissive area RE1 of the peripheral lens LEe on the driving backplane BP.

Apparently, in other embodiments of the present disclosure, the above-mentioned polygon may also be replaced by a circle, an ellipse or other shapes.

Figure 4:
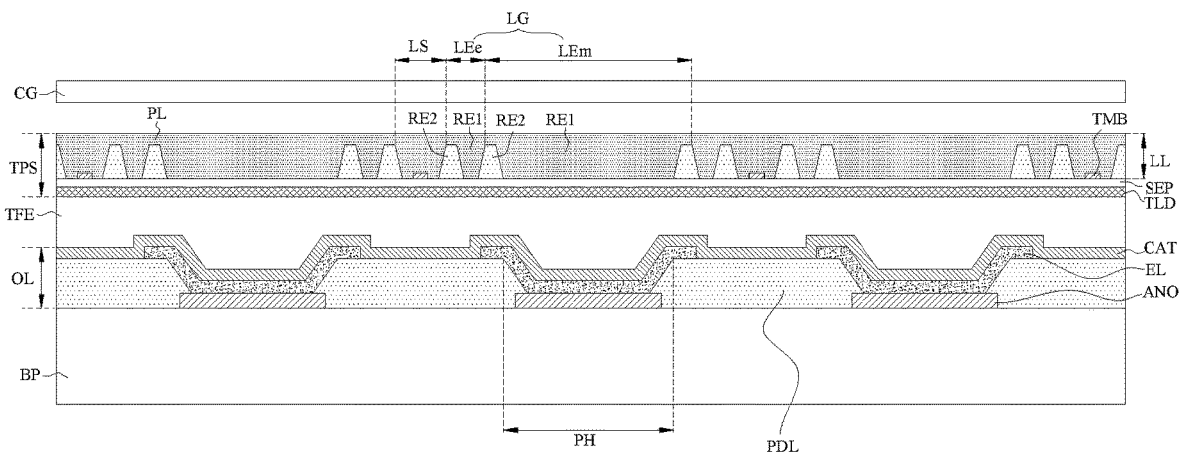
FIG. 4 is a partial cross-sectional view of the display panel according to Embodiment 3 of the present disclosure.
Figure 5:
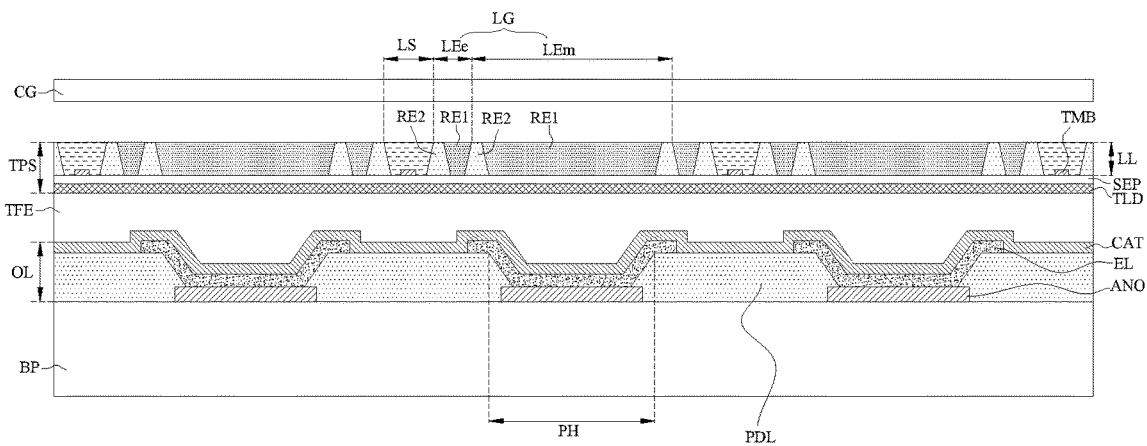
FIG. 5 is a partial cross-sectional view of the display panel according to Embodiment 4 of the present disclosure.

As shown in FIG. 5, in order to stack other film layers on the lens layer LL, the spacer LS may be used to fill the area outside the lens group LG in the lens layer LL, so that the lens layer LL becomes a continuous layer structure. Specifically, the spacer LS may be arranged on the same layer as each lens group LG, and has a plurality of through holes. Each lens group LG is provided in a respective through hole in a one-to-one correspondence, so that each lens group LG can be separated by the spacer LS. At the same time, as shown in FIG. 2, FIG. 4, FIG. 6, FIG. 8 and FIG. 9, one of the inner light-transmissive area RE1 and the outer light-transmissive area RE2 may be made of the same material as the spacer LS, so that the spacer LS is formed at the same time with the inner light-transmissive area RE1 or the outer light-transmissive area RE2, thereby simplifying the processing.

In some embodiments of the present disclosure, as shown in FIG. 4, the lens layer LL further includes a cover layer PL that may cover the lens group LG and the spacer LS. In order to simplify the processing, the cover layer PL, the spacer LS and the inner light-transmissive area RE1 may be integrally structured. When forming the lens layer LL, the material of the outer light-transmissive area RE2 may be used to form the outer light-transmissive area RE2 through a photolithography process, and then coated with the material of the inner light-transmissive area RE1, thereby simultaneously forming the cover layer PL, the spacer LS and the inner light-transmissive area RE1.

Figure 8:
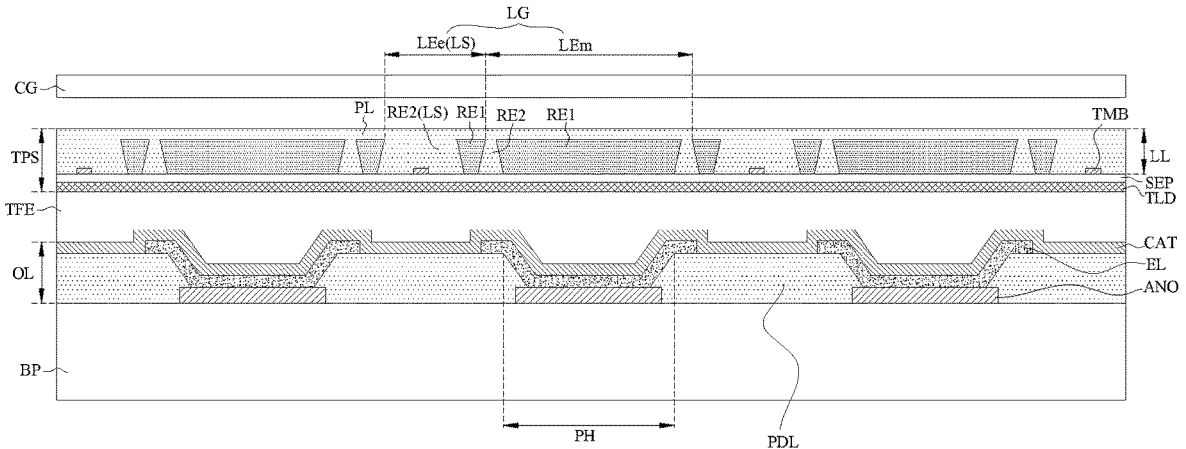
FIG. 8 is a partial cross-sectional view of the display panel according to Embodiment 6 of the present disclosure.

In some embodiments of the present disclosure, as shown in FIG. 8, the cover layer PL, the spacer LS and the outer light-transmissive area RE2 may be of an integral structure. When forming the lens layer LL, the material of the inner light-transmissive area RE1 may be used to form the inner light-transmissive area RE1 through a photolithography process, and then coated with the material of the outer light-transmissive area RE2, thereby simultaneously forming the cover layer PL, the spacer LS and the outer light-transmissive area RE2.

In other embodiments of the present disclosure, as shown in FIG. 1, FIG. 2, FIG. 6, and FIG. 9, thicknesses of the spacer LS, the inner light-transmissive area RE1, and the outer light-transmissive area RE2 are the same, and the above mentioned cover layer PL may not be arranged on the lens layer LL in an embodiment of the present disclosure. That is, thicknesses of the spacer LS, the inner light-transmissive area RE1, and the outer light-transmissive area RE2 are the thickness of the lens layer LL, so as to avoid additional light loss caused by the cover layer PL. When forming the lens layer LL, the cover layer PL may be ground after forming the cover layer PL, the lens group LG and the spacer LS at the same time. Alternatively, the spacer LS with the same thickness as the lens group LG may be formed after forming the lens group LG.

It should be noted that the cover layer PL, the spacer LS, the inner light-transmissive area RE1, and the outer light-transmissive area RE2 above are only differentiated for the convenience of describing the structure of the lens layer LL, and this does not mean that there must be obvious boundaries among these structures in the lens layer LL. For example, if the cover layer PL and the spacer LS are an integral structure, there may not be any obvious physical boundaries between the two.

In some embodiments of the present disclosure, as shown in FIG. 2, FIG. 5, FIG. 6, FIG. 8, and FIG. 9, the protective layer of the touch layer TPS may be replaced by the lens layer LL, and the touch electrode layer TMB may be covered directly by the lens layer LL. This helps to protect the touch electrode layer TMB while improving the light extraction efficiency. In this way, the lens layer LL may also be regarded as a part of the touch layer TPS. That is, the lens layer LL is reused as the protective layer of the touch layer TPS, which is conducive to reducing the thickness of the display panel.

At the same time, as shown in FIG. 3 and FIG. 7, in order to prevent the touch electrode layer TMB from blocking the lens group LG, for the touch electrode layer TMB with a mesh structure, the orthographic projection on the driving backplane BP of a lens group LG may be located within the orthographic projection on the driving backplane BP of a mesh hole TH, and the orthographic projection on the backplane of a light-emitting device is located within the orthographic projection on the driving backplane BP of a lens group LG. For example, a mesh hole TH corresponds to only one light-emitting device, and corresponds to only one lens group LG. The range of the mesh hole TH is larger than the corresponding light-emitting device and lens group LG. Thus, the channel line Ltm of the touch electrode may be located outside from the lens group LG. At the same time, the width of the channel line Ltm is smaller than the distance between two adjacent lens groups LG, and the orthographic projection of the channel line Ltm on the driving backplane BP is located outside from the orthographic projection of the lens group LG on the driving backplane BP, so that part of the channel line Ltm may be located between two adjacent lens groups LG, and may be covered by the spacer LS.

Apparently, in other embodiments of the present disclosure, as shown in FIG. 1, the lens layer LL may also be arranged on the side of the protective layer TOC of the touch layer TPS away from the driving backplane BP. That is, the lens layer LL is not reused as the protective layer TOC.

In some embodiments of the present disclosure, as shown in FIG. 9, the color filter layer may be arranged on the side of the lens layer LL away from the driving backplane BP. The structure and principle of the color filter layer have been described in detail above, and will not be repeated herein.

The cover plate CG may be made of transparent material such as glass or acrylic, and may be disposed on the side of the lens layer LL away from the driving backplane BP. For example, the cover plate CG may be disposed on the side of the color filter layer away from the driving backplane BP. The film layer covered by the cover plate CG may be protected by the cover plate CG.

The present disclosure provides a manufacturing method for a display panel. The display panel may be the display panel described in any of the above embodiments. The manufacturing method may include step S110 to step S140.

Step S110, forming a driving backplane.

Step S120, forming a light-emitting layer on a side of the driving backplane, where the light-emitting layer includes a plurality of light-emitting devices arranged in an array.

Step S130, forming a lens layer on the side of the light-emitting layer away from the driving backplane, where the lens layer includes a plurality of lens groups arranged in an array. One lens group is arranged corresponding to one of the light-emitting devices. The lens group includes a central lens and at least one peripheral lens surrounding the central lens. Each of the central lens and the peripheral lens includes an inner light-transmissive area and an outer light-transmissive area that fits and surrounds the inner light-transmissive area. In the same lens group, the refractive index of the inner light-transmissive area is greater than the refractive index of the outer light-transmissive area.

Step S140, forming a cover plate on the side of the lens layer away from the driving backplane.

The details about other steps of the above-mentioned manufacturing method and the beneficial effects of the manufacturing method may refer to the above emobodiments of the display panel, and will not be described in detail herein.

The present disclosure also provides a display device, and the display device may include the display panel described in any of the foregoing emobodiments. The display panel is a display panel in any of the above-mentioned emobodiments, and its specific structure and beneficial effects may refer to the above-mentioned emobodiments of the display panel, which will not be repeated herein. The display device according to an embodiment of the present disclosure may be an electronic device with a display function, such as a mobile phone, a tablet computer, and a television, and will not be listed herein.

Other embodiments of the present disclosure will be readily apparent to those skilled in the art from consideration of the specification and practice of the content disclosed herein. The present application is intended to cover any modification, use or adaptation of the present disclosure, and these modifications, uses or adaptations follow the general principle of the present disclosure and include common knowledge or conventional technical means in the technical field not disclosed in the present disclosure. The specification and examples are to be considered exemplary only, with the true scope and spirit of the present disclosure indicated by the appended claims.

The invention claimed is:

1. A display panel, comprising:
a driving backplane;
a light-emitting layer, arranged on a side of the driving backplane, and comprising a plurality of light-emitting devices arranged in an array;
a lens layer, arranged on a side of the light-emitting layer away from the driving backplane, and comprising a plurality of lens groups arranged in an array, wherein one of the lens groups is arranged corresponding to at least one of the light-emitting devices, wherein the lens group comprises a central lens and at least one peripheral lens surrounding the central lens, wherein each of the central lens and the at least one peripheral lens comprises an inner light-transmissive area and an outer light-transmissive area fitting the inner light-transmissive area and surrounding the inner light-transmissive area, and wherein in a same lens group, a refractive index of the inner light-transmissive area is greater than a refractive index of the outer light-transmissive area; and
a cover plate, arranged on a side of the lens layer away from the driving backplane.

2. The display panel according to claim 1, wherein the display panel further comprises:
a touch electrode layer, arranged on the side of the light-emitting layer away from the driving backplane, wherein
the lens layer covers the touch electrode layer.

3. The display panel according to claim 2, wherein the touch electrode layer is a mesh structure having a plurality of mesh holes and formed by connecting a plurality of channel lines;
an orthographic projection on the driving backplane of at least one of the lens groups is located within an orthographic projection on the driving backplane of one of the mesh holes; and an orthographic projection on the driving backplane of one of the light-emitting devices is located within an orthographic projection on the driving backplane of one of the lens groups.

4. The display panel according to claim 3, wherein a width of the channel line is smaller than a distance between two adjacent ones of the lens groups, and an orthographic projection on the driving backplane of the channel line is located outside of an orthographic projection on the driving backplane of the lens group.

5. The display panel according to claim 2, wherein the display panel further comprises:
an encapsulation layer, covering the light-emitting layer;
a buffer layer, covering the encapsulation layer;
a transfer layer, arranged on a surface of the buffer layer away from the driving backplane, and comprising a plurality of transfer bridges; and
an isolation layer, covering the transfer layer, wherein the touch electrode layer is arranged on a surface of the isolation layer away from the driving backplane, the touch electrode layer comprises a plurality of first electrode blocks and a plurality of second electrode blocks, and the first electrode blocks are connected by the transfer bridges to form a plurality of first touch electrodes, and the second electrode blocks are connected to form a plurality of second touch electrodes intersecting with the first touch electrodes.

6. The display panel according to claim 1, wherein the lens layer further comprises:
a spacer, arranged on a same layer as each lens group and used for separating each lens group, wherein
one of the inner light-transmissive area and the outer light-transmissive area is made of a same material as the spacer.

7. The display panel according to claim 6, wherein the lens layer further comprises:
a cover layer, covering the lens groups and the spacer, wherein
the cover layer, the spacer, and the inner light-transmissive area are integrally structured.

8. The display panel according to claim 6, wherein the lens layer further comprises:
a cover layer, covering the lens groups and the spacer, wherein
the cover layer, the spacer, and the outer light-transmissive area are integrally structured.

9. The display panel according to claim 1, wherein a boundary of an orthographic projection on the driving backplane of the light-emitting device coincides with an inner boundary of an orthographic projection on the driving backplane of the outer light-transmissive area of a respective central lens.

10. The display panel according to claim 1, wherein orthographic projections on the driving backplane of the light-emitting device and the inner light-transmissive area and the outer light-transmissive area of a respective lens group are in a same shape.

11. The display panel according to claim 10, wherein, among one of the light-emitting devices and a respective lens group,
a boundary of an orthographic projection on the driving backplane of the light-emitting device is in a shape of polygon, a boundary of an orthographic projection on the driving backplane of the inner light-transmissive area of the central lens is in a shape of polygon, and an outer boundary of an orthographic projection on the driving backplane of the inner light-transmissive area of the peripheral lens is in a shape of polygon;

each side of the boundary of the orthographic projection on the driving backplane of the light-emitting device is parallel to or coincides with a respective side of the inner boundary of the orthographic projection on the driving backplane of the outer light-transmissive area of the central lens; and each side of the boundary of the orthographic projection on the driving backplane of the light-emitting device is parallel to a respective side of the outer boundary of the orthographic projection on the driving backplane of the inner light-transmissive area of the peripheral lens.

12. The display panel according to claim 1, wherein the display panel further comprises:

a color filter layer, arranged on a side of the lens layer away from the driving backplane, and comprising color resists each corresponding to a respective one of the light-emitting devices.

13. The display panel according to claim 1, wherein an inner peripheral surface of each of the outer light-transmissive areas is a slope surface expanding in a direction away from the driving backplane.

14. The display panel according to claim 13, wherein a width between an inner boundary and an outer boundary of an orthographic projection on the driving backplane of the outer light-transmissive area is greater than or equal to 2 μm and less than or equal to 3 μm.

15. The display panel according to claim 13, wherein a slope angle of the slope surface is greater than or equal to 50° and less than or equal to 90°.

16. The display panel according to claim 1, wherein a refractive index of the inner light-transmissive area is greater than or equal to 1.6 and less than or equal to 1.75; and a refractive index of the outer light-transmissive area is greater than or equal to 1.4 and less than or equal to 1.55.

17. A display device, comprising a display panel, wherein the display panel comprises:

a driving backplane;

18 a light-emitting layer, arranged on a side of the driving backplane, and comprising a plurality of light-emitting devices arranged in an array;

a lens layer, arranged on a side of the light-emitting layer away from the driving backplane, and comprising a plurality of lens groups arranged in an array, wherein one of the lens groups is arranged corresponding to at least one of the light-emitting devices, wherein the lens group comprises a central lens and at least one peripheral lens surrounding the central lens, wherein each of the central lens and the at least one peripheral lens comprises an inner light-transmissive area and an outer light-transmissive area fitting the inner light-transmissive area and surrounding the inner light-transmissive area, and wherein in a same lens group, a refractive index of the inner light-transmissive area is greater than a refractive index of the outer light-transmissive area; and a cover plate, arranged on a side of the lens layer away from the driving backplane.

18. The display device according to claim 17, wherein the display panel further comprises:

a touch electrode layer, arranged on the side of the light-emitting layer away from the driving backplane, wherein the lens layer covers the touch electrode layer.

19. The display device according to claim 17, wherein the lens layer further comprises:

a spacer, arranged on a same layer as each lens group and used for separating each lens group, wherein one of the inner light-transmissive area and the outer light-transmissive area is made of a same material as the spacer.

20. The display device according to claim 17, wherein a boundary of an orthographic projection on the driving backplane of the light-emitting device coincides with an inner boundary of an orthographic projection on the driving backplane of the outer light-transmissive area of a respective central lens.

* * * * *